(12) United States Patent
Carlson (10) Patent No.: US 8,960,235 B2
(45) Date of Patent: Feb. 24, 2015

(54) GAS DISPERSION APPARATUS

(75) Inventor: David K. Carlson, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 586 days.

(21) Appl. No.: 13/284,416

(22) Filed: Oct. 28, 2011

(65) Prior Publication Data
US 2013/0109159 A1 May 2, 2013

(51) Int. Cl.
*C23C 16/455* (2006.01)
*H01J 37/32* (2006.01)

(52) U.S. Cl.
CPC ..... *C23C 16/45565* (2013.01); *C23C 16/45574* (2013.01)
USPC ... 137/884; 137/561 A; 137/340; 137/599.03; 118/715

(58) Field of Classification Search
CPC ............ H01J 37/3244; H01J 37/32633; C23C 16/45574
USPC ................ 137/561 A, 340, 884, 594, 599.03; 118/715
See application file for complete search history.

(56) References Cited

U.S. PATENT DOCUMENTS 5,423,936 A * 6/1995 Tomita et al. ............ 156/345.34
7,942,969 B2 5/2011 Riker et al.
2002/0020696 A1 * 2/2002 Kitamura et al. ............. 219/390
2006/0263522 A1 * 11/2006 Byun .......................... 427/248.1
2008/0264566 A1 * 10/2008 Kim et al. ................ 156/345.34
2008/0295872 A1 * 12/2008 Riker et al. ..................... 134/105
2010/0180819 A1 7/2010 Hatanaka et al.
2011/0163651 A1 * 7/2011 Linow et al. ................... 313/113

FOREIGN PATENT DOCUMENTS

JP 2003-238178 A 8/2003
KR 10-2003-0008295 A 1/2003

OTHER PUBLICATIONS

U.S. Appl. No. 13/192,101, filed Jul. 27, 2011, Sanchez et al.
International Search Report and Written Opinion mailed Mar. 29, 2013 for PCT Application No. PCT/US2012/059309.

* cited by examiner

*Primary Examiner* — Atif Chaudry
(74) *Attorney, Agent, or Firm* — Moser Taboada; Alan Taboada (57) ABSTRACT

A gas dispersion apparatus for use with a process chamber, comprising: a quartz body having a top, a ring coupled to a bottom surface of the top and a bottom plate having dispersion holes coupled to the ring opposite the top; a plurality of quartz plates disposed between the top and the bottom plate, wherein the plurality of plates are positioned above one another and spaced apart to form a plenum above each of the plurality of plates and the bottom plate; a plurality of quartz tubes to couple the plenums to the plurality of dispersion holes, each of the plurality of quartz tubes having a first end disposed within one of the plenums and having a second end coupled to one of the dispersion holes; and a plurality of conduits disposed through the top, wherein each of the plurality of conduits is coupled to one of the plenums.

18 Claims, 8 Drawing Sheets

GAS DISPERSION APPARATUS

FIELD

Embodiments of the present invention generally relate to semiconductor processing equipment.

BACKGROUND

Conventional gas dispersion apparatuses used in semiconductor process chambers (e.g., such as showerheads, gas dispersion heads, or the like) typically include a water cooled stainless steel body having a plurality of gas dispersion holes configured to provide one or more process gases to a processing volume of a process chamber. However, the inventors have observed that due to the heat transfer properties of stainless steel, conventional gas dispersion apparatus may provide inadequate temperature control for some applications, which may increase the occurrence of gas phase reactions and/or disassociation of the process gas components within the gas dispersion apparatus.

In some conventional apparatus, the gas dispersion holes may be sized to provide a high velocity gas injection of the process gas components to reduce the likelihood of gas phase reactions and disassociation of the process gas components. However, the inventor has further observed that such a high velocity inject creates gas flow vortices proximate the gas dispersion holes, thereby leading to an increased particle deposition near the gas dispersion holes, thus requiring more frequent cleaning and maintenance of the gas dispersion apparatus.

Moreover, the inventor has observed that conventional gas dispersion apparatus utilizing a stainless steel construction provide poor particle formation and metal contamination control, which further leads to more frequent required cleaning and maintenance, further increasing the downtime and reducing the efficiency of the process chamber.

Therefore, the inventor has provided an improved gas distribution apparatus that may overcome at least some of the aforementioned problems and/or may provide other benefits, as discussed below.

SUMMARY

Embodiments of gas dispersion apparatus are provided herein. In some embodiments, a gas dispersion apparatus for use with a process chamber may include: a quartz body having a top, a ring coupled to a bottom surface of the top and a bottom plate having a plurality of dispersion holes coupled to the ring opposite the top; a plurality of quartz plates disposed between the top and the bottom plate, wherein the plurality of quartz plates are positioned above one another and spaced apart to form a plenum above each of the plurality of quartz plates and the bottom quartz plate; a plurality of quartz tubes to couple the plenums to the plurality of dispersion holes, each of the plurality of quartz tubes having a first end disposed within one of the plenums and having a second end coupled to one of the plurality of dispersion holes; and a plurality of conduits disposed through the top of the body, wherein each of the plurality of conduits is coupled to one of the plenums to provide a process gas to the plenums.

In some embodiments, a gas dispersion apparatus to provide gases to a process chamber may include a quartz body having a processing side, a second side opposite the processing side, and at least three plenums enclosed within the quartz body between the processing side and the second side, wherein each plenum is isolated from each other plenum and at least three sets of gas dispersion holes disposed on the second side of the body, wherein each set of the at least three sets of gas dispersion holes is fluidly coupled to a respective one of the at least three plenums; a plurality of quartz tubes disposed within the quartz body, each quartz tube coupled a gas dispersion hole to one of the at least three plenums; and a plurality of conduits disposed through the second side of the body, wherein at least one of the plurality of conduits is coupled to a respective one of the at least three plenums to provide a process gas to the respective plenum.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of gas dispersion apparatus are provided herein. In at least some embodiments, the inventive apparatus may advantageously provide increased temperature control, improved response time to temperature changes, and/or a larger dynamic operating range as compared to conventional gas dispersion apparatus. At least some embodiments of the inventive apparatus may further advantageously provide reduced particle formation and contamination, thereby requiring less frequent cleanings and maintenance and, thus, reduced downtime. At least some embodiments of the inventive apparatus may further advantageously provide a lower inject velocity of process gases, thus further providing a gas dispersion apparatus having reduced particle formation and contamination, thereby requiring less frequent cleanings and maintenance and, thus, reduced downtime.

Figure 1:
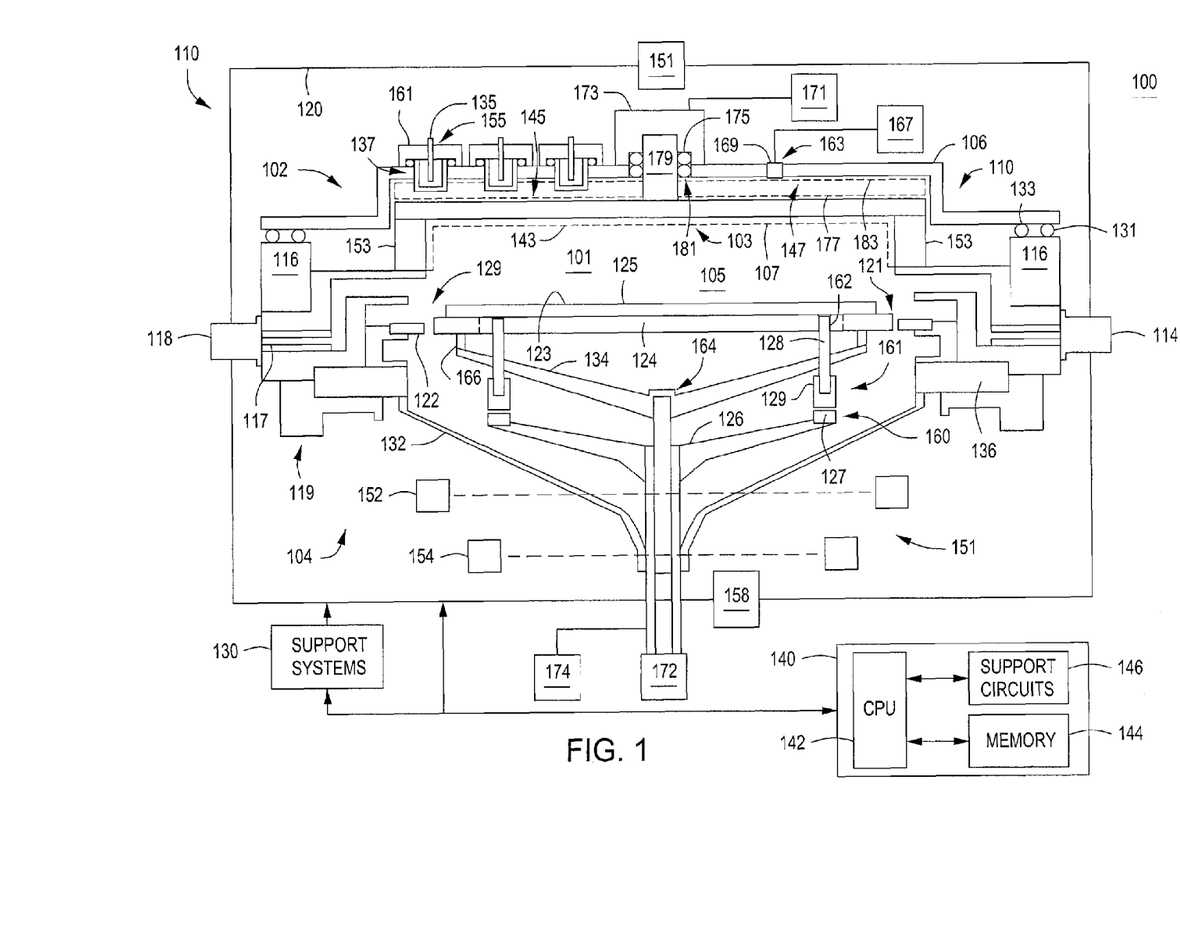
FIG. 1 depicts a schematic side view of a process chamber suitable for use with gas dispersion apparatus in accordance with some embodiments of the present invention.

FIG. 1 depicts a schematic side view of a process chamber 100 in accordance with some embodiments of the present invention. In some embodiments, the process chamber 100 may be a commercially available process chamber, such as the RP EPI® reactor, available from Applied Materials, Inc. of Santa Clara, Calif., or any suitable semiconductor process chamber adapted for performing deposition processes, for example, such as an epitaxial deposition.

The process chamber 100 generally comprises a chamber body 110 defining an inner volume 101, a gas dispersion apparatus 103 and a substrate support 124 configured to support a substrate 125 and disposed within the inner volume 101. The inner volume 101 comprises a processing volume 105 defined as an area between the gas dispersion apparatus 103 and the substrate support 124. The process chamber 100 may further include support systems 130, and a controller 140, as discussed in more detail below.

In some embodiments, an injector 114 may be disposed proximate a first side 121 of the substrate support 124 to provide one or more process gases across a processing surface 123 of the substrate 125 when the substrate 125 is disposed on the substrate support 124.

In some embodiments, a heated exhaust manifold 118 may be disposed proximate a second side 119 of the substrate support 124, opposite the injector 114, to exhaust the one or more process gases from the process chamber 100. The heated exhaust manifold 118 may include an opening that is about the same width as the diameter of the substrate 125 or larger. In some embodiments, the heated exhaust manifold 118 may include an adhesion reducing liner 117. The adhesion reducing liner may comprise any materials, for example, such as quartz, nickel impregnated fluoropolymer, nickel dioxide, a combination thereof, or the like.

The chamber body 110 generally includes an upper portion 102, a lower portion 104, and an enclosure 120. The upper portion 102 is disposed on the lower portion 104 and includes a chamber lid 106 and an upper chamber liner 116. In some embodiments, one or more seals (e.g. two o-rings 131, 133 shown) may be disposed between the chamber lid 106 and upper chamber liner 116 to facilitate a vacuum seal between the components. In some embodiments, an upper pyrometer 156 may be provided to provide data regarding the temperature of the processing surface of the substrate during processing.

In some embodiments, the upper chamber liner 116 may be disposed above the injector 114 and heated exhaust manifold 118 and below the chamber lid 106, as depicted. In some embodiments the upper chamber liner 116 may comprises a material, such as quartz or the like, for example, to at least partially reflect energy radiated from the substrate 125 and/or from lamps disposed below the substrate support 124. In some embodiments, the upper chamber liner 116, the chamber lid 106, and a lower chamber liner 136 (discussed below) may be quartz, thereby advantageously providing a quartz envelope surrounding the substrate 125.

The chamber lid 106 may have any suitable geometry, such as flat (as illustrated) or having a dome-like shape (not shown), or other shapes, such as reverse curve lids are also contemplated. The chamber lid 106 may comprise any suitable material, for example such as stainless steel, aluminum, quartz or the like. Accordingly, in some embodiments, the chamber lid 106 may at least partially reflect energy radiated from the substrate 125 and/or from lamps disposed below the substrate support 124. In some embodiments, the chamber lid 106 may be a liquid cooled lid to facilitate temperature control of the gas dispersion apparatus 103.

In some embodiments, one or more thermocouples (three thermocouples 135 shown) may be disposed within through holes 137 formed in the chamber lid 106 and positioned proximate the gas dispersion apparatus 103 to facilitate monitoring and controlling a temperature of the gas dispersion apparatus 103. The thermocouples 135 may be positioned in any manner suitable to allow for the temperature of the gas dispersion apparatus 103 to be monitored at separate locations. For example, in embodiments where three thermocouples are present (such as in FIG. 1), the three thermocouples may be respectfully disposed at about 40 mm, about 90 mm and about 140 mm from a center of the gas dispersion apparatus 103. The location of the thermocouples may depend on the specific geometry of the gas dispersion apparatus 100. For example, they may be placed to correspond to temperature zones, or they may be placed based on the geometry of the system (e.g., near the edge of the susceptor, near the edge of the substrate, about one-half the radius of the substrate, near the center of the substrate, or the like).

In some embodiments, the thermocouples 135 may be disposed within a housing 155 to allow the thermocouples 135 to be positioned proximate the gas dispersion apparatus 103 while not exposing the thermocouples 135 to the environment within the inner volume 101. In some embodiments, the housing 155 may comprise a bottom 147 configured to fit within the through hole of the chamber lid 106 and a top 141 coupled to the bottom 149 and configured to retain the thermocouples 135 in a static position. In some embodiments, a seal (e.g., o-ring 161) may be disposed between the top 141 and the chamber lid 106 to provide a vacuum seal.

The lower portion 104 generally comprises a baseplate assembly 119, a lower chamber liner 136, a lower dome 132, the substrate support 124, a pre-heat ring 122, a substrate lift assembly 160, a substrate support assembly 164, a heating system 151, and a lower pyrometer 158. The heating system 151 may be disposed below the substrate support 124 to provide heat energy to the substrate support 124. The heating system 151 may comprise one or more upper lamps 152 and one or more lower lamps 154. Although the term "ring" is used to describe certain components of the process chamber, such as the pre-heat ring 122, it is contemplated that the shape of these components need not be circular and may include any shape, including but not limited to, rectangles, polygons, ovals, and the like. The lower chamber liner 136 may be disposed below the injector 114 and the heated exhaust manifold 118, for example, and above the baseplate assembly 119. The injector 114 and the heated exhaust manifold 118 are generally disposed between the upper portion 102 and the lower portion 104 and may be coupled to either or both of the upper portion 102 and the lower portion 104.

The substrate support 124 may be any suitable substrate support, such as a plate or ring (illustrated by dotted lines) to support the substrate 125 thereon. The substrate support assembly 164 generally includes a support bracket 134 having a plurality of support pins 166 coupled to the substrate support 124. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion 129. The lift pin 128 is movably disposed through a first opening 162 in the substrate support 124. In operation, the substrate lift shaft 126 is moved to engage the lift pins 128. When engaged, the lift pins 128 may raise the substrate 125 above the substrate support 124 or lower the substrate 125 onto the substrate support 124.

The substrate support 124 may further include a lift mechanism 172 and a rotation mechanism 174 coupled to the substrate support assembly 164. The lift mechanism 172 can be utilized to move the substrate support 124 in a direction perpendicular to the processing surface 123 of the substrate 125. For example, the lift mechanism 172 may be used to position the substrate support 124 relative to the showerhead 170 and the injector 114. The rotation mechanism 174 can be utilized for rotating the substrate support 124 about a central axis. In operation, the lift mechanism may facilitate dynamic control of the position of the substrate 125 with respect to the flow field created by the injector 114 and/or gas dispersion apparatus 103. Dynamic control of the substrate 125 position in combination with continuous rotation of the substrate 125 by the rotation mechanism 174 may be used to optimize exposure of the processing surface 123 of the substrate 125 to the flow field to optimize deposition uniformity and/or composition and minimize residue formation on the processing surface 123.

During processing, the substrate 125 is disposed on the substrate support 124. The lamps 152, and 154 are sources of infrared (IR) radiation (i.e., heat) and, in operation, generate a pre-determined temperature distribution across the substrate 125. The chamber lid 106, the upper chamber liner 116, and the lower dome 132 may be formed from quartz as discussed above; however, other IR-transparent and process compatible materials may also be used to form these components. The lamps 152, 154 may be part of a multi-zone lamp heating apparatus to provide thermal uniformity to the backside of the substrate support 124. For example, the heating system 151 may include a plurality of heating zones, where each heating zone includes a plurality of lamps. For example, the one or more lamps 152 may be a first heating zone and the one or more lamps 154 may be a second heating zone. The lamps 152, 154 may provide a wide thermal range of about 200 to about 900 degrees Celsius. The lamps 152, 154 may provide a fast response control of about 5 to about 20 degrees Celsius per second. For example, the thermal range and fast response control of the lamps 152, 154 may provide deposition uniformity on the substrate 125. Further, the lower dome 132 may be temperature controlled, for example, by active cooling, window design or the like, to further aid control of thermal uniformity on the backside of the substrate support 124, and/or on the processing surface 123 of the substrate 125.

The inner volume 101 may accommodate any suitably sized substrate, for example, such as 200 mm, 300 mm or the like. The inner volume 101 may have a varying volume, for example, the size of the inner volume 101 may shrink when the lift mechanism 172 raises the substrate support 124 closer to the chamber lid 106 and expand when the lift mechanism 172 lowers the substrate support 124 away from the chamber lid 106. In some embodiments, the inner volume 101 may be cooled by one or more active or passive cooling components. For example, the inner volume 101 may be passively cooled by the walls of the process chamber 100, which for example, may be stainless steel or the like. For example, either separately or in combination with passive cooling, the inner volume 101 may be actively cooled, for example, by flowing a coolant about the process chamber 100. For example, the coolant may be a liquid, such as water, or a gas.

The support systems 130 may include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100.

In some embodiments, a controller 140 may be coupled to the process chamber 100 and support systems 130, directly or, alternatively, via computers (or controllers) associated with the process chamber and/or the support systems. The controller 140 may be one of any form of general-purpose computer processor that can be used in an industrial setting for controlling various chambers and sub-processors. The memory, or computer-readable medium 144, of the CPU 142 may be one or more of readily available memory such as random access memory (RAM), read only memory (ROM), floppy disk, hard disk, or any other form of digital storage, local or remote. The support circuits 146 are coupled to the CPU 142 for supporting the processor in a conventional manner. These circuits include cache, power supplies, clock circuits, input/output circuitry and subsystems, and the like.

The gas dispersion apparatus 103 may be positioned in any manner suitable within the process chamber 100 to provide a sufficient gas distribution to the surface 123 of the substrate 125. For example, in some embodiments, the gas dispersion apparatus 103 may be disposed above the substrate support 124 (e.g., opposing the substrate support 124), such as shown in FIG. 1. The gas dispersion apparatus 103 may have any dimensions suitable to provide sufficient gas distribution to the surface 123 of the substrate 125. For example in some embodiments, the gas dispersion apparatus 103 may have a diameter of about 12__ to about 14 inches (300 to 350 mm). In some embodiments, the gas dispersion apparatus 103 may have a diameter that is up to about 50% greater than the substrate (e.g., 18" or 450 mm for a 300 mm substrate). Of course other dimensions may be used in process chambers having other dimensions or configured for processing smaller or larger substrates.

In some embodiments, the gas dispersion apparatus 103 may be positioned within the process chamber 100 such that a gas feed 179 of the gas dispersion apparatus 103 is disposed within a through hole 181 formed in the chamber lid 106. In such embodiments, a gas distribution block 173 may be coupled to the gas feed 179 to facilitate providing one or more process gases from a gas supply 171 to the gas feed 179. The gas distribution block 173 may comprise any process suitable material that is inert to the process. For example, in some embodiments, the gas distribution block 173 may be a metal such as stainless steel, aluminum, or the like. In some embodiments, the gas distribution block 173 may be a coated material or a ceramic, depending on the specific chemistries used in the process. In some embodiments, the gas distribution block 173 may be quartz. In some embodiments, one or more seals (two o-rings 175 shown) may be disposed between one or more of the gas feed 179, gas distribution block 173 and chamber lid 106 to provide a vacuum seal. In some embodiments the gas dispersion apparatus 103 may be supported by a portion of an inner liner 153 of the process chamber 100. In such embodiments, the gas distribution apparatus 103 may be held in place by the chamber lid 106 and inner liner 153.

In some embodiments, the gas distribution apparatus 103 may comprise one or more mechanisms to facilitate control over the temperature of the gas distribution apparatus 103. For example, in some embodiments a reflective coating may be disposed on one or more surfaces of the gas distribution apparatus 103 or interior surfaces of the process chamber 100. For example, in some embodiments, the reflective coating may be disposed on a substrate facing surface 143 (e.g., the bottom plate 214 described below with respect to FIG. 2) of the gas distribution apparatus 103 (shown in phantom at 107). In such embodiments, the reflective coating may be disposed on one or more adjacent surfaces of the inner liner 153. In some embodiments, the reflective coating may be disposed on a top surface 145 of the gas distribution apparatus 103 (shown in phantom at 177). In some embodiments, the reflective coating may be disposed on an inner surface 147 of the chamber lid 106 (shown in phantom at 183). The reflective coating may comprise any material suitable to provide control over the temperature of the gas distribution apparatus 103. For example, in some embodiments, the reflective coating may be a quartz ($SiO_2$) reflective coating. In some embodiments, the quartz ($SiO_2$) reflective coating may be opaque. In some embodiments, for example where an opaque quartz ($SiO_2$) reflective coating is disposed on the top surface 145 of the gas distribution apparatus 103 a transparent quartz (SiO$_2$) reflective coating may be disposed on the substrate facing surface 143.

Alternatively, or in combination, in some embodiments, a gas supply 167 may provide one or more gases to a gas inlet 169 to provide a flow of gas about the gas distribution apparatus 103 to facilitate control over the temperature of the gas distribution apparatus 103. In some embodiments, the gas inlet 169 may be disposed within a through hole 163 formed in the chamber lid 106. The gas may be any type of gas suitable to provide control over the temperature of the gas distribution apparatus 103 and may be selected or changed in accordance with a desired temperature change of the gas distribution apparatus 103. For example, in embodiments where a temperature increase is desired, a gas having high heat transfer properties, for example such as nitrogen (N$_2$) may be utilized. Alternatively, in embodiments where a temperature decrease is desired a gas having poor heat transfer properties, for example such as helium (He) or hydrogen (H$_2$) may be utilized.

Figure 2:
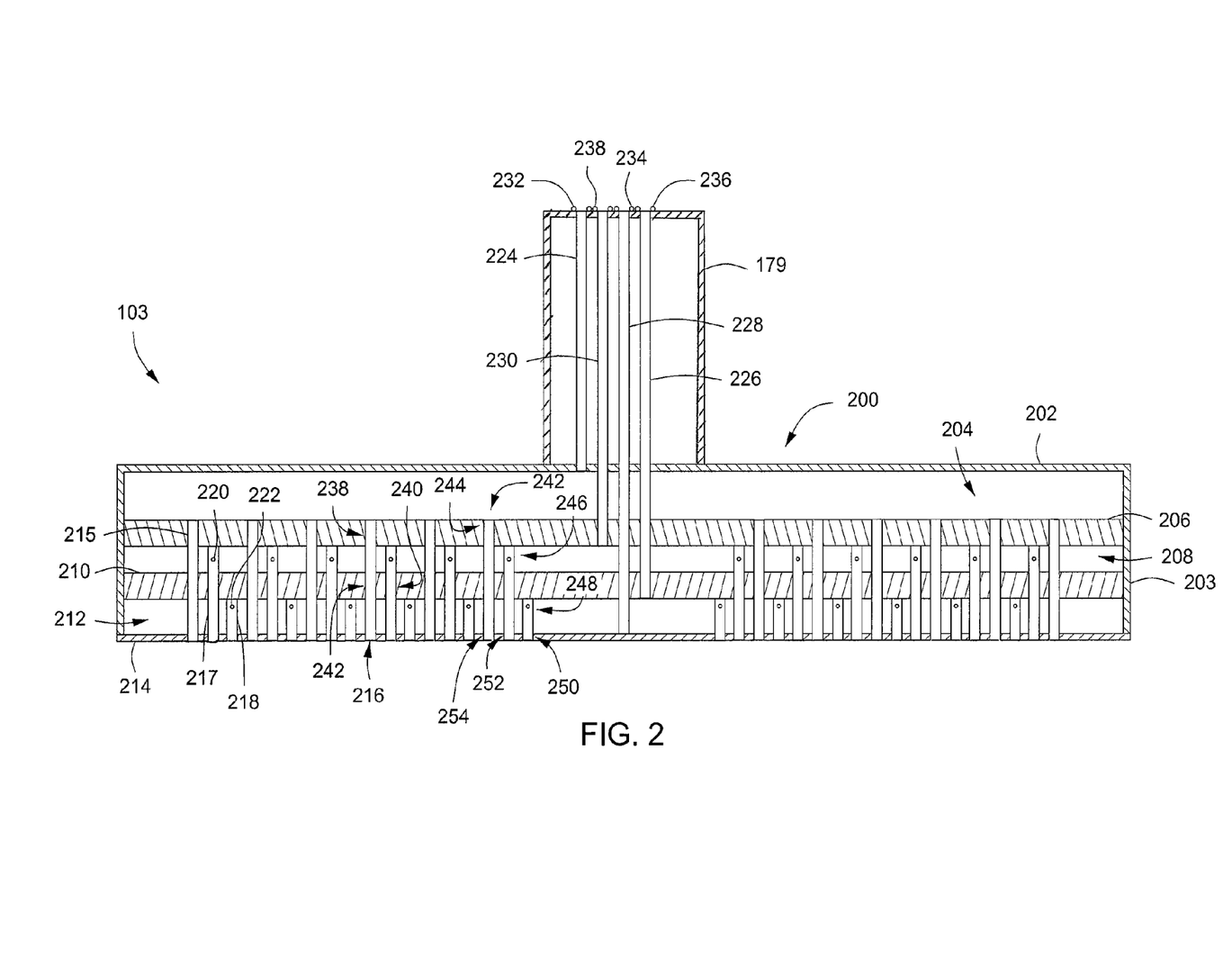
FIGS. 2-7 depict cross sectional views of various embodiments of a gas dispersion apparatus in accordance with some embodiments of the present invention.

Referring to FIG. 2, in some embodiments, the gas distribution apparatus 103 may generally comprise a body 200 and a plurality of plates (two plates 206, 210 shown) disposed within the body 200 and configured to provide a plurality of gases from the gas feed 179 to a plurality of gas dispersion holes 216 formed in a bottom plate 214. As used herein, relative terms such as top or bottom are used for descriptive purposes only and are not limiting of the invention. For example, the gas dispersion apparatus may be provided at an angle, sideways, or upside down relative to the process chamber or a substrate disposed therein to be processed. For example, more generally, the body has a processing side (e.g., the bottom plate 214) where the plurality of gas dispersion holes are arranged, and a second side opposite the processing side. The bottom plate 214 may have any amount of gas dispersion holes 216 having any dimensions suitable to provide a desired dispersion of process gases to a process chamber (e.g., process chamber 100 described above), for example, such as described below with respect to FIG. 8.

In some embodiments, the gas distribution apparatus 103 may be fabricated from quartz (SiO$_2$). By fabricating the gas distribution apparatus 103 from quartz (SiO$_2$), the inventors have observed that a metal contamination and/or particle formation within the gas distribution apparatus 103 may be reduced or eliminated. For example, in some embodiments, the gas distribution apparatus 103 may comprise a metal content of less than about $1e10^9$ parts per million (ppm), or in some embodiments less than about $1e10^9$ ppm. By reducing or eliminating the metal contamination and/or particle formation the gas dispersion apparatus may be cleaned in-situ, thus reducing downtime required for maintenance and increasing the efficiency of the process chamber 100.

In addition, by fabricating the gas distribution apparatus 103 from quartz (SiO$_2$) the inventors have observed that due to the low heat transfer properties of quartz (SiO$_2$) as compared to conventional gas distribution apparatus materials such as metal (e.g., stainless steel, aluminum, or the like) the gas distribution apparatus may have an improved temperature response time to temperature changes within the process chamber, thereby increasing the temperature control and dynamic operating range of the gas distribution apparatus. Moreover, the comparatively low heat transfer properties of quartz (SiO$_2$) may reduce instances of decomposition or dissociation of the process gas compounds.

In some embodiments, the body 200 may comprise a top 202 and a ring 203 coupled to, and extended outwardly from, the top 202. The bottom plate 214 may be coupled to the ring 203 opposite the top 202. In some embodiments, the plurality of plates (plates 206, 210) disposed within the body 200 are positioned such that a plurality of plenums (three plenums 204, 208, 212 shown) are formed within the body 200. In some embodiments, three plenums, or at least three plenums may be provided. For example, as shown in FIG. 2, a first plenum (plenum 204) is formed between the top 202 and a first plate (plate 206), a second plenum (plenum 208) is formed between the first plate (plate 206) and a second plate (plate 210) and a third plenum 212 is formed between the second plate (plate 210) and the bottom plate 214.

In some embodiments, a plurality of tubes (first set of tubes 215 coupled to plenum 204, second set of tubes 217 coupled to plenum 208 and third set of tubes 218 coupled to plenum 212 shown) may be disposed within the body 200 and configured to couple each of the plurality of plenums to a respective grouping of the plurality of the gas dispersion holes 216. In such embodiments, each plate of the plurality of plates (plates 206, 210) may comprise a plurality of through holes 238, 240, 242 configured to allow each of the plurality of tubes to be coupled to the gas dispersion holes 216. The plurality of tubes may be configured in any manner suitable to couple the plurality of plenums to the plurality of the gas dispersion holes 216. For example, in some embodiments, each of the plurality of tubes may comprise a first end 244, 246, 248 coupled to the one of the plurality of plenums and a second end 250, 252, 254 coupled to one of the gas dispersion holes 216. In some embodiments, the first end 244 of the tube (e.g., tube 215) may comprise an open end 258. Alternatively, or in combination, in some embodiments, the first end 246, 248 of the tube (e.g. tube 216, 218) may comprise a hole 220, 222 disposed in a side of the tube.

In some embodiments, a plurality of conduits (three conduits 224, 226, 230 shown) are disposed within the gas feed 179 and through the top 202 of the body 200 and each coupled to one of the plenums 204, 208, 212. Each of the plurality of conduits 224, 226, 230 are coupled to a gas supply (e.g., gas supply 171 described above) and configured to each provide a process gas independent of the other conduits. For example, in embodiments where an epitaxial process, such as a metalorganic chemical vapor deposition (MOCVD) is performed to form a Group III-V semiconductor layer, a first conduit (e.g., conduit 224) may provide a first process gas comprising a Group III compound, a second conduit (e.g., conduit 226) may provide a second process gas comprising a Group V compound and a third conduit (e.g., conduit 230) may provide a third process gas comprising purge or dopant gas. By providing each of the process gases via separate conduit to a separate plenum, gas-phase reactions prior to the gases reaching a processing volume of a process chamber (e.g., processing volume 105 of process chamber 100 described above) are reduced, thereby increasing the efficiency of the process. In addition, by providing each of the process gases via separate conduit to a separate plenum, each of the process gases may be derived from a different source. For example, in the example described above each of the first, second and third process gases may independently be provided from a solid, liquid or gaseous precursor. Moreover, by providing by providing each of the process gases via separate conduit to a separate plenum the inner volume within the body 202 may be reduced, thereby allowing for gases to be switched efficiently, thus allowing for dynamic changes to be made while performing processes within the process chamber, for example such as abrupt heterojunction growth in epitaxially deposited layers.

In some embodiments, an additional conduit 228 may be disposed within the gas feed 179 and extending into the body 200 proximate bottom plate 214. In some embodiments, a temperature measuring device, for example such as a fiber optic probe, such as a quartz fiber optic probe, a thermocouple probe, or the like, to facilitate monitoring a temperature of the gas dispersion apparatus 103.

In some embodiments, a seal (e.g., o-rings 232, 234, 236, 256) may be disposed proximate a top of the plurality of conduits 224, 226, 230 and the additional conduit 228 to provide an air-tight seal when connecting to other components. In some embodiments, the plurality of conduits 224, 226, 230 and the additional conduit 228 are tubes mounted within the gas feed 179. Alternatively, in some embodiments, the gas feed 179 may be fabricated from a solid piece of material, for example such as stainless steel, and the plurality of conduits 224, 226, 230 and the additional conduit 228 are channels formed in the gas feed 179, for example as described below with respect to FIGS. 5-7.

Figure 3:
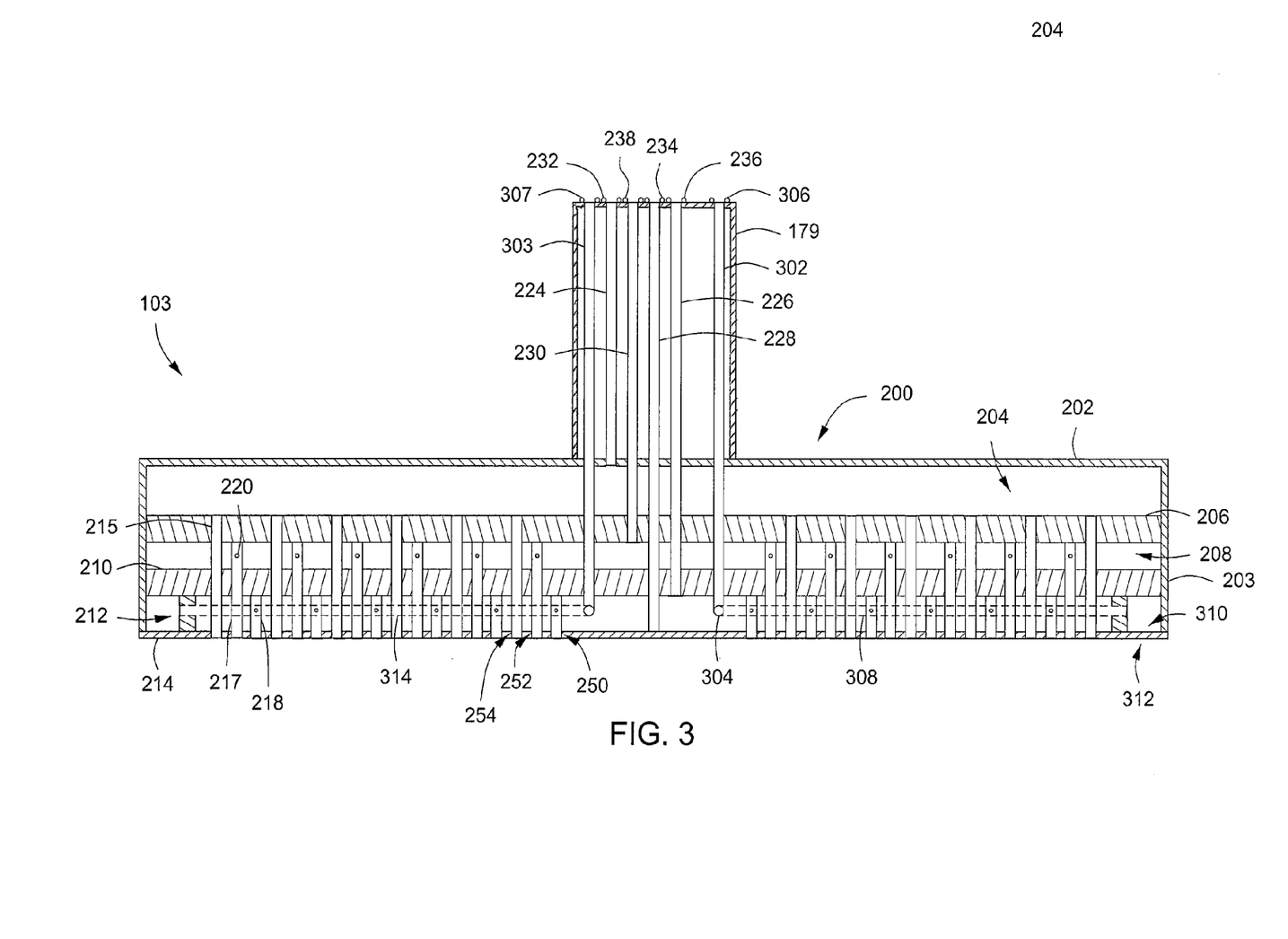

Referring to FIG. 3, in some embodiments, the gas distribution apparatus may comprise a coolant channel 310 disposed proximate an edge 312 of the body 200 and configured to allow a flow of coolant gas around the edge 312 of the body 200 to facilitate temperature control over the gas distribution apparatus 103. The coolant gas may be any suitable gas, for example such as helium (He), hydrogen ($H_2$), argon (Ar), nitrogen ($N_2$), or the like, depending on the application.

In some embodiments, a gas supply (e.g., gas supply 171 described above) may provide the coolant gas to the coolant channel 310 via a gas supply conduit 302, gas ring 304 and supply channel 308. A return channel 314 may be coupled to the gas ring 304 and a gas return conduit 303, thereby establishing a flow path from the to the gas supply conduit 302 through the coolant channel 310 to the return conduit 303. O-rings 306, 307 or other suitable seals may be provided proximate any connections of the gas supply and return conduits 302, 303 to other components.

Figure 4:
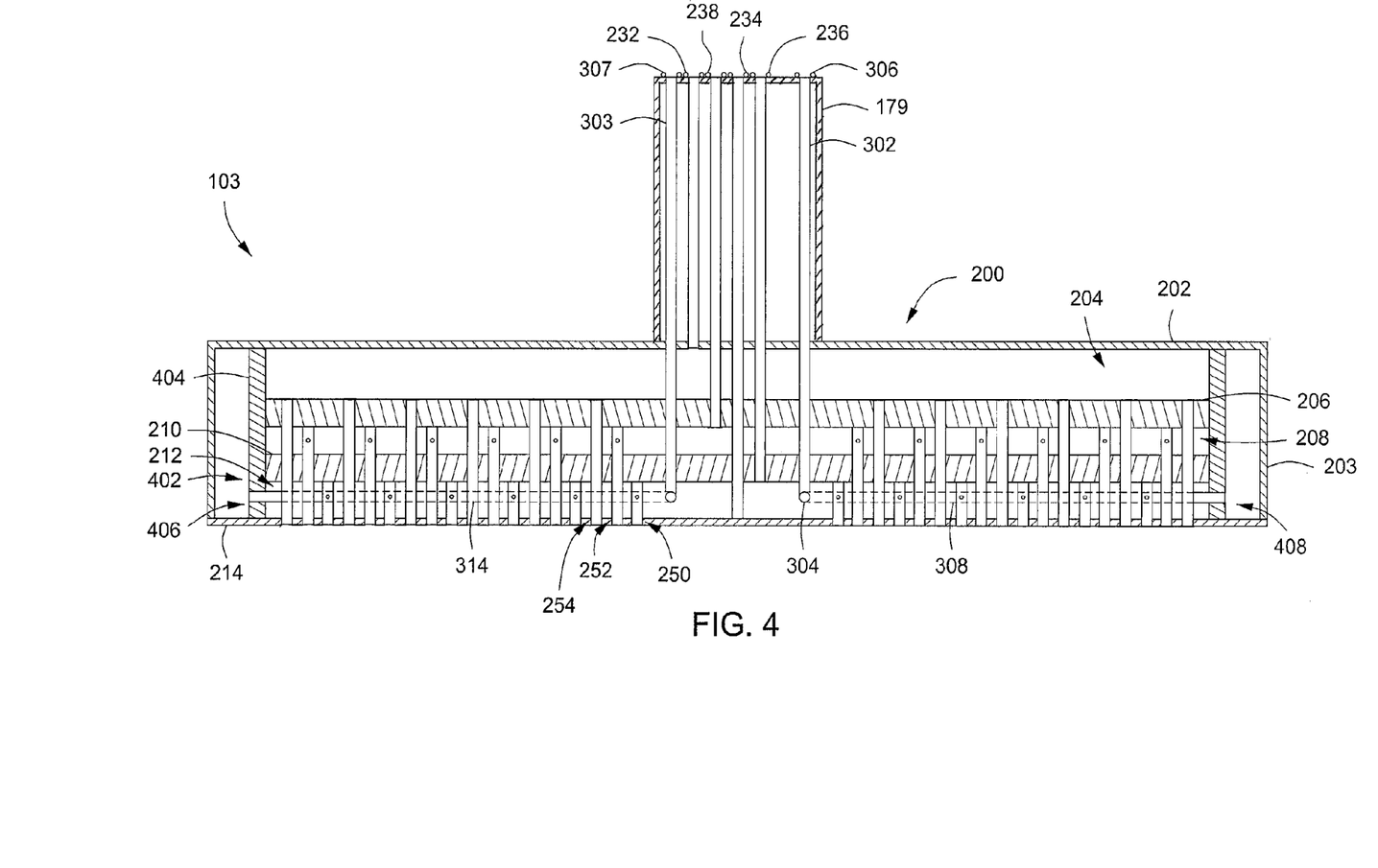

The coolant channel 310 may be positioned in any manner and comprise any size sufficient to provide the desired temperature control over the gas distribution apparatus 103. For example, in some embodiments, the coolant channel 310 may disposed above the bottom plate 214 and below an adjacent plate (plate 210) and have a size similar to that of an adjacent plenum (e.g., plenum 212), as depicted in FIG. 3. Alternatively, in some embodiments, the coolant channel 402 may be positioned adjacent to the plates (plates 206, 210) and extends from the top 202 of the body 200 to the bottom plate 214, such as depicted in FIG. 4. In such embodiments, a ring 404 having a plurality of through holes (two through holes 406, 408 shown) configured to interface with the supply channel 308 and return channel 314 may be disposed within the body 200 to define the coolant channel 402. The ring 404 may be any size suitable to provide the coolant channel 402 having desired dimensions. For example, in some embodiments, the ring 404 may have a wall thickness (outer diameter minus inner diameter) of about 0.25 inches to about 1 inch, or about 0.5 inches. In some embodiments, the ring 404 may have an outer diameter of about 13.78 inches, although other dimensions may be used depending upon the configuration of the gas distribution apparatus 103.

Figure 5:
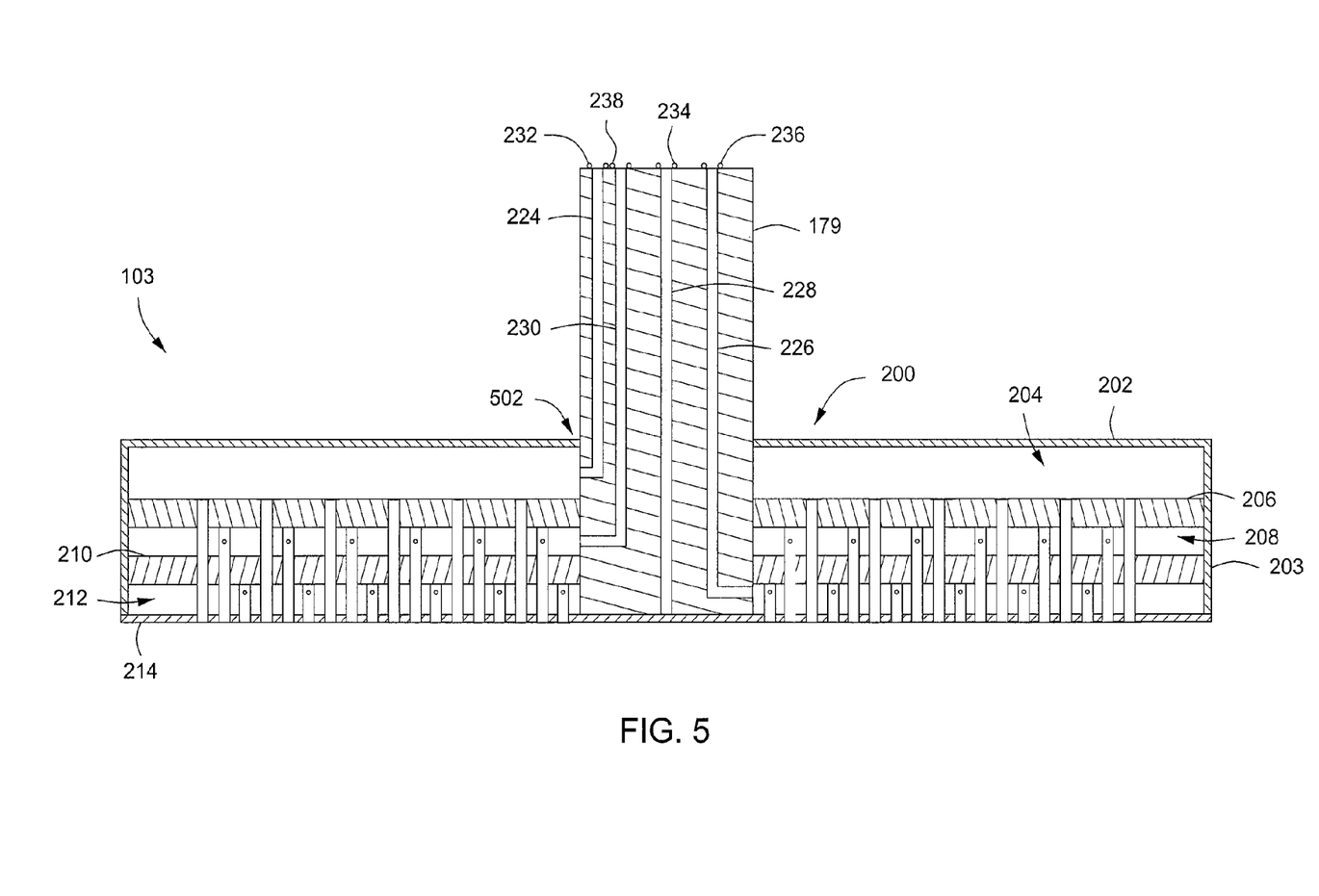

Referring to FIG. 5, in some embodiments, the gas feed 179 may be fabricated from a solid piece of material having a plurality of channels formed therein to form the plurality of conduits 224, 226, 230 and the additional conduit 228. In such embodiments, the gas feed 179 may be disposed within a through hole 502 formed in the top 202 of the body 200 and the plates 206, 210, wherein a bottom of the gas feed 179 is disposed proximate the bottom plate 214, for example as shown in the figure. The gas feed 179 may be fabricated from any suitable material, for example a metal such as stainless steel, aluminum, or the like.

The gas feed 179 may have any dimensions suitable to accommodate the plurality of conduits 224, 226, 230 and the additional conduit 228. For example, in some embodiments, the gas feed may have an outer diameter of about 0.75 to about 2 inches, or in some embodiments, about 1 inch, although other dimensions may be used depending upon the configuration of the gas distribution apparatus 103. In some embodiments, the gas feed 179 may have an overall length of about 3.00 inches, although other dimensions may be used depending upon the configuration of the gas distribution apparatus 103.

Figure 6:
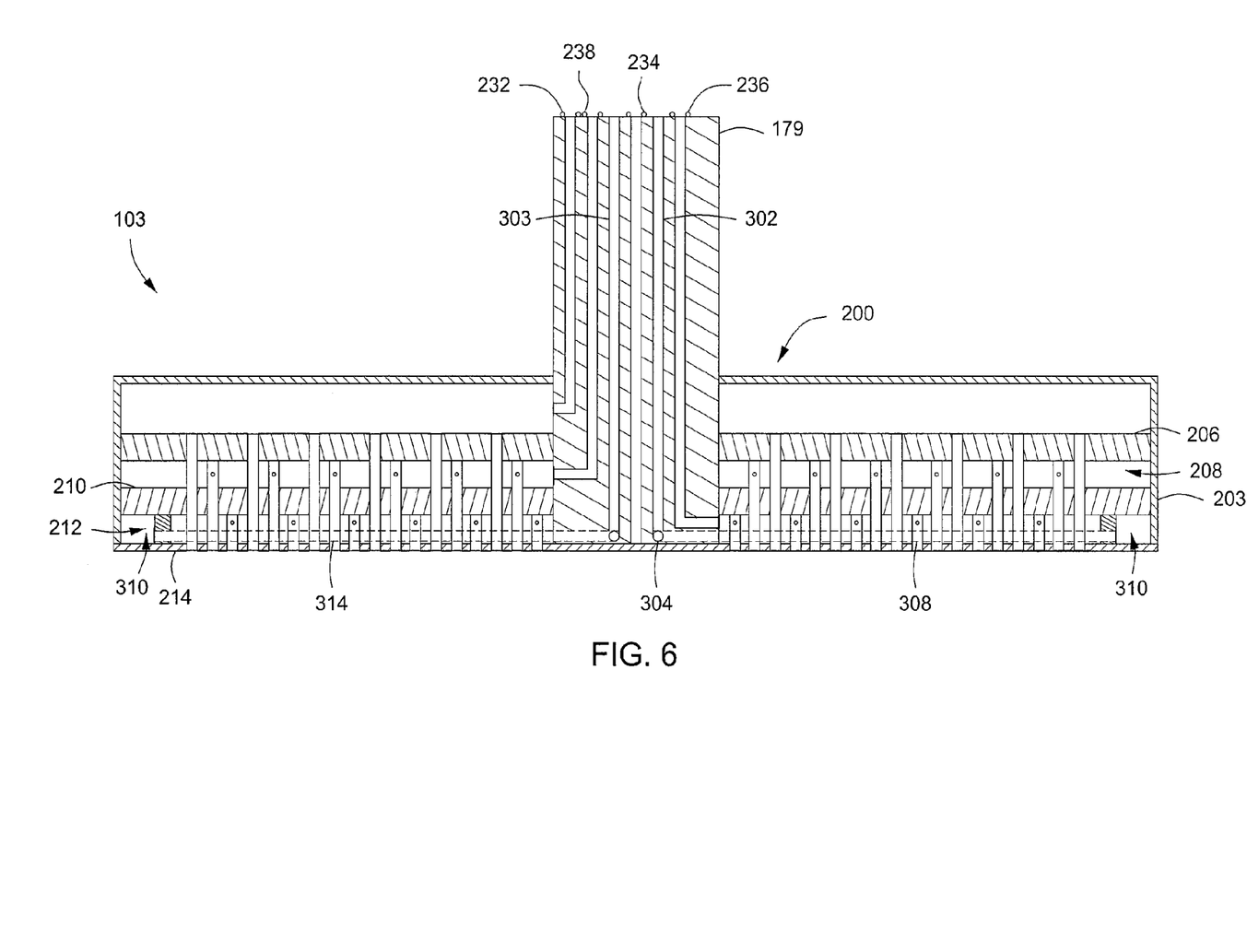
Figure 7:
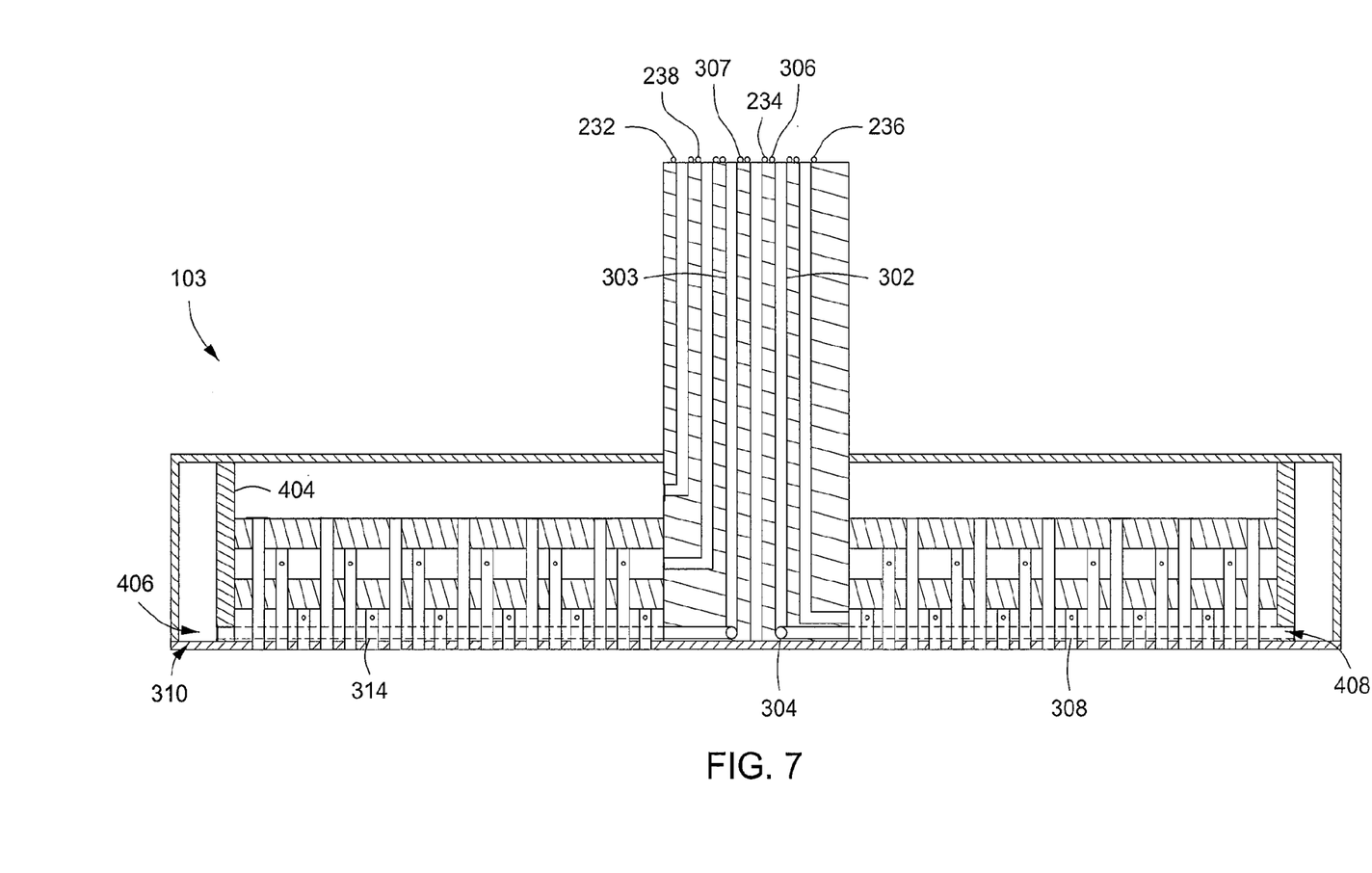

Referring to FIG. 6, in embodiments where the gas feed 179 is fabricated from a solid piece of material, as described above, the gas distribution apparatus may comprise a coolant channel 310 disposed proximate an edge 312 of the body 200 and configured to allow a flow of coolant gas around the edge 312 of the body 200 to facilitate temperature control over the gas distribution apparatus 103, for example as described above with respect to FIG. 3. In some embodiments, the coolant channel 310 may be disposed above the bottom plate 214 and below an adjacent plate (plate 210) and have a size similar to that of an adjacent plenum (e.g., plenum 212), as depicted in FIG. 6. Alternatively, in some embodiments, the coolant channel 402 may be positioned adjacent to the plates (plates 206, 210) and extends from the top 202 of the body 200 to the bottom plate 214, such as depicted in FIG. 7.

Figure 8:
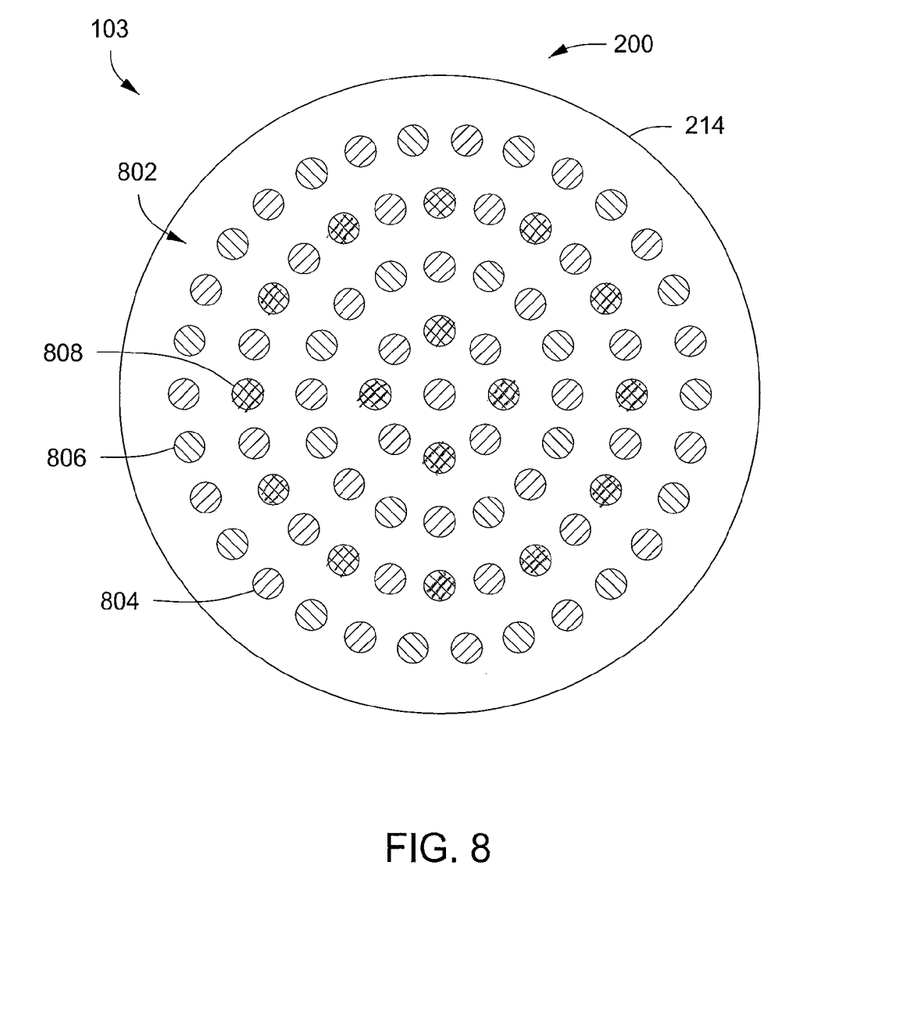
FIG. 8 depicts a bottom view of a gas dispersion apparatus in accordance with some embodiments of the present invention.

Referring to FIG. 8, the gas distribution apparatus 103 may comprise any amount of gas dispersion holes 802 suitable to provide a desired distribution of process gases. In some embodiments, the gas distribution apparatus 103 may comprise about 100 to about 500 gas distribution holes per process gas utilized. For example, in embodiments where three process gases (e.g., a first process gas comprising a Group III compound, a second process gas comprising a Group V compound and a third process gas comprising purge or dopant gas, as described above) are utilized, the gas dispersion apparatus 103 may comprise a total of about 300 to about 1500, or in some embodiments, about 880 gas dispersion holes 802 subdivided into, for example, first gas dispersion holes 804, second gas dispersion holes 806, and third gas dispersion holes 808. The number and pattern of gas dispersion holes 804, 806, 808 is illustrative only. The gas dispersion holes 802 (and the pattern of gas dispersion holes 804, 806, 808) may be spaced in accordance with a desired gas distribution gradient for gases provided from each plenum as well as overall. For example, in some embodiments, gas dispersion holes 802 providing the same process gas may have a spacing of about 8 to about 16 mm, or in some embodiments about 10 mm. In addition, the gas dispersion holes 802 may be formed from tubes having a suitable wall thickness, for example, such as about 0.5 to about 1.5 mm, or in some embodiments, about 1 mm.

The gas dispersion holes 802 may have any dimensions suitable to provide a desired velocity of the process gases dispersed by the gas dispersion apparatus 103. For example, in some embodiments each of the gas dispersion holes 802 may have a diameter of about 1 to about 6 mm, or in some embodiments, about 1 to about 4 mm. By providing gas dispersion holes 802 having a larger diameter as compared to dispersion hole sizes found in conventional gas dispersion apparatuses, the inventors have observed that the velocity of the process gases dispersed by the gas dispersion apparatus 103 may be decreased, thereby reducing the formation of vortices formed proximate the gas dispersion holes 802, thus reducing or eliminating instances of particle formation on or about the gas dispersion holes 802. For example, the velocity of the process gases dispersed by the gas dispersion apparatus 103 may be about 1 to about 30 cm/sec. In addition, by providing gas dispersion holes 802 having a larger diameter machining tolerances of the gas dispersion holes 802 are less critical, thereby providing a faster and more efficient gas distribution apparatus 103 fabrication process.

While the foregoing is directed to embodiments of the present invention, other and further embodiments of the invention may be devised without departing from the basic scope thereof.

The invention claimed is:

1. A gas dispersion apparatus to provide gases to a process chamber, comprising:
    a quartz body having a top, a ring coupled to a bottom surface of the top and a bottom plate having a plurality of gas dispersion holes coupled to the ring opposite the top;
    a plurality of quartz plates disposed between the top and the bottom plate, wherein the plurality of quartz plates are vertically arranged and spaced apart to form a plenum above each of the plurality of quartz plates and the bottom plate;
    a plurality of quartz tubes to couple the plenums to the plurality of dispersion holes, each of the plurality of quartz tubes having a first end disposed within one of the plenums and having a second end coupled to one of the plurality of dispersion holes;
    a plurality of conduits disposed through the top of the body, wherein each of the plurality of conduits is coupled to one of the plenums to provide a process gas to the plenums; and
    a gas feed to house the plurality of conduits and having a portion extending away from the quartz body such that the portion can be disposed within a through hole formed in a wall or ceiling of the process chamber.

2. The gas dispersion apparatus of claim 1, wherein the plurality of gas dispersion holes have a diameter of about 1 to about 6 millimeters.

3. The gas dispersion apparatus of claim 1, wherein the plurality of gas dispersion holes comprise about 100 to about 500 gas dispersion holes per plenum.

4. The gas dispersion apparatus of claim 1, further comprising a reflective coating disposed on at least one of a bottom surface of the body, a top surface of the body or a surface of the process chamber disposed proximate the body.

5. The gas dispersion apparatus of claim 4, wherein the surface of the process chamber disposed proximate the body is one of an inner surface of a wall or ceiling of the process chamber or a portion of a liner disposed within the process chamber and configured to support the gas dispersion apparatus.

6. The gas dispersion apparatus of claim 4, wherein the reflective coating comprises a transparent or opaque layer of quartz ($SiO_2$).

7. The gas dispersion apparatus of claim 1, wherein the gas feed is a hollow tube coupled to the top of the body and wherein the plurality of conduits are a plurality of tubes disposed within the gas feed.

8. The gas dispersion apparatus of claim 1, wherein the gas feed is a solid block disposed within the body and wherein the plurality of conduits are a plurality of channels formed within the solid block.

9. The gas dispersion apparatus of claim 8, wherein the solid block is fabricated from stainless steel or aluminum.

10. The gas dispersion apparatus of claim 1, further comprising:
    a liner disposed within the process chamber, wherein the body rests atop a portion of the liner.

11. The gas dispersion apparatus of claim 1, wherein the process chamber comprises a gas inlet disposed in a wall or ceiling of the process chamber proximate the body to provide a temperature control gas proximate an outer surface of the body.

12. The gas dispersion apparatus of claim 11, wherein the temperature control gas is one of helium, hydrogen, or nitrogen.

13. The gas dispersion apparatus of claim 1, further comprising:
    one or more thermocouples disposed in a wall or ceiling of the process chamber proximate the body to monitor a temperature of the gas dispersion apparatus.

14. A gas dispersion apparatus to provide gases to a process chamber, comprising:
    a quartz body having a top, a ring coupled to a bottom surface of the top and a bottom plate having a plurality of gas dispersion holes coupled to the ring opposite the top;
    a plurality of quartz plates disposed between the top and the bottom plate, wherein the plurality of quartz plates are vertically arranged and spaced apart to form a plenum above each of the plurality of quartz plates and the bottom plate;
    a plurality of quartz tubes to couple the plenums to the plurality of dispersion holes, each of the plurality of quartz tubes having a first end disposed within one of the plenums and having a second end coupled to one of the plurality of dispersion holes;
    a plurality of conduits disposed through the top of the body, wherein each of the plurality of conduits is coupled to one of the plenums to provide a process gas to the plenums; and
    a channel disposed within the body and proximate an outer edge of body, the channel configured to provide a flow of coolant gas around the outer edge of the body to control a temperature of the gas dispersion apparatus, wherein the channel is disposed between a bottom plate of the plurality of plates and the bottom plate of the body.

15. The gas dispersion apparatus of claim 14, wherein the channel is disposed between the top and bottom plate of the body and around an outer edge of the plurality of plates.

16. The gas dispersion apparatus of claim 14 wherein the coolant gas is helium or nitrogen.

17. A gas dispersion apparatus to provide gases to a process chamber, comprising:
    a quartz body having a processing side, a second side opposite the processing side, at least three plenums enclosed within the quartz body between the processing side and the second side, and at least sets of gas dispersion holes disposed on the second side of the body, wherein each plenum is isolated from each other plenum, and wherein each set of the at least three sets of gas dispersion holes is fluidly coupled to a respective one of the at least three plenums;
    a plurality of quartz tubes disposed within the quartz body, each quartz tube coupled a gas dispersion hole to one of the at least three plenums;
    a plurality of conduits disposed through the second side of the body, wherein at least one of the plurality of conduits is coupled to a respective one of the at least three plenums to provide a process gas to the respective plenum; and
    a gas feed to house the plurality of conduits and having a portion extending away from the quartz body such that the portion can be disposed within a through hole formed in a wall or ceiling of the process chamber.

18. The gas dispersion apparatus of claim 17, wherein the gas dispersion holes of the at least three sets of gas dispersion holes have a diameter of about 1 to about 6 millimeters.

* * * * *

UNITED STATES PATENT AND TRADEMARK OFFICE
CERTIFICATE OF CORRECTION

| | | |
|---|---|---|
| PATENT NO. | : 8,960,235 B2 | Page 1 of 1 |
| APPLICATION NO. | : 13/284416 | |
| DATED | : February 24, 2015 | |
| INVENTOR(S) | : David K. Carlson | |

It is certified that error appears in the above-identified patent and that said Letters Patent is hereby corrected as shown below:

In the Claims

Col. 12 line 52 the phrase "at least sets of gas dispersion holes" recited in claim 17 should be replaced with the phrase "at least three sets of gas dispersion holes."

Signed and Sealed this
Eighth Day of September, 2015

Michelle K. Lee
*Director of the United States Patent and Trademark Office*